United States Patent
Wu

(10) Patent No.: US 8,399,298 B2
(45) Date of Patent: *Mar. 19, 2013

(54) RULE-BASED SEMICONDUCTOR DIE STACKING AND BONDING WITHIN A MULTI-DIE PACKAGE

(75) Inventor: Charles Hung-Hsiang Wu, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/445,671

(22) Filed: Apr. 12, 2012

(65) Prior Publication Data

US 2012/0196403 A1 Aug. 2, 2012

Related U.S. Application Data

(63) Continuation of application No. 12/702,065, filed on Feb. 8, 2010, now Pat. No. 8,158,457.

(51) Int. Cl.
 *H01L 21/00* (2006.01)
(52) U.S. Cl. ........... 438/109; 438/107; 257/E21.499
(58) Field of Classification Search ............. 438/83; 257/E21.512, E21.513

See application file for complete search history.

(56) References Cited

U.S. PATENT DOCUMENTS

| | | | |
|---|---|---|---|
| 5,998,864 A | 12/1999 | Khandros et al. | |
| 6,008,532 A | 12/1999 | Carichner | |
| 6,359,340 B1 | 3/2002 | Lin et al. | |
| 6,851,100 B1 | 2/2005 | You et al. | |
| 8,158,457 B2 * | 4/2012 | Wu | 438/109 |

FOREIGN PATENT DOCUMENTS

JP 3053538 A 3/1991

OTHER PUBLICATIONS

Zarkesh-Ha, Global Interconnect Modeling for a Gigascale System-on-a-Chip (GSoC), Georgia Institute of Technology, Feb. 2001.
English translation of Abstract for JP3053538 published Mar. 7, 1991.
International Search Report and Written Opinion dated May 3, 2011 in International Patent Application No. PCT/US2011/023884.
Office Action dated Nov. 9, 2011 in U.S. Appl. No. 12/702,065.
Response to Office Action filed Dec. 9, 2011 in U.S. Appl. No. 12/702,065.
Notice of Allowance and Fee(s) Due dated Dec. 16, 2011 in U.S. Appl. No. 12/702,065.

* cited by examiner

*Primary Examiner* — Cheung Lee
(74) *Attorney, Agent, or Firm* — Vierra Magen Marcus LLP

(57) ABSTRACT

A rule-based method of optimizing wire bonding jumps is disclosed which minimizes the amount of wire used for wire bonds and/or minimizes a number of power and ground pads on a substrate to support all wired connections.

27 Claims, 16 Drawing Sheets

Fig. 5
(Prior Art)

| Finger | Die 0 | Die 1 | Die 2 | Die 3 | Die 4 | Die 5 | Die 6 | Die 7 | | |
|--------|-------|-------|-------|-------|-------|-------|-------|-------|--------|--------|
| GND | 0 | 0 | 0 | 0 | 1 | 1 | 1 | 1 | CADD2x | Pin 20 |
| Vcc | | | | | | | | | | |
| GND | 0 | 0 | 1 | 1 | 0 | 0 | 1 | 1 | CADD1x | Pin 21 |
| GND | 0 | 1 | 0 | 1 | 0 | 1 | 0 | 1 | CADD0x | Pin 23 |
| PWR | | | | | | | | | | |
| GND | | | | | | | | | | |

Bottom of Stack — Top of Stack

RULE-BASED SEMICONDUCTOR DIE STACKING AND BONDING WITHIN A MULTI-DIE PACKAGE

PRIORITY DATA

This application is a continuation of U.S. patent application Ser. No. 12/702,065 entitled "RULE-BASED SEMICONDUCTOR DIE STACKING AND BONDING WITHIN A MULTI-DIE PACKAGE," filed on Feb. 8, 2010, to be issued as U.S. Pat. No. 8,158,457.

BACKGROUND

1. Field

Embodiments relate to a rule-based stacking and wire bonding of semiconductor die in a multi-die semiconductor package.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a so-called three-dimensional stacked configuration. An edge view of a conventional semiconductor package 20 (without molding compound) is shown in prior art FIGS. 1 and 2. Typical packages include a plurality of semiconductor die 22, 24 mounted to a substrate 26. While two such die are shown, it is known to stack eight or more die in a semiconductor package. The semiconductor die may be formed with die bond pads, referred to herein as pins, on an upper surface of the die. Substrate 26 may be formed of an electrically insulating core sandwiched between upper and lower conductive layers. The upper and/or lower conductive layers may be etched to form conductance patterns including electrical leads and contact pads. The contact pads are referred to herein as fingers. Wire bonds are soldered between the pins of the semiconductor die 22, 24 and the fingers of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

As shown in prior art FIG. 1, it is known to stack two or more semiconductor die directly on top of each other, thereby taking up a small footprint on the substrate. However, in a stacked configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 1, it is therefore known to provide a dielectric spacer layer 34 to provide enough room for the wire bond 30 to be bonded to the pin on the lower die 24.

As an alternative to an aligned stack of semiconductor die, it is known to stack semiconductor die on top of each other with an offset as shown in prior art FIGS. 2-4, so that the pins of the next lower die are left exposed. Such configurations are shown for example in U.S. Pat. No. 6,359,340 to Lin, et al., entitled, "Multichip Module Having A Stacked Chip Arrangement." An offset configuration provides an advantage of convenient access of the pins on each of the semiconductor die. For configurations such as shown in FIG. 2 having a small number of die, for example 2, it is known to wire bond each die in the stack directly to the substrate. However, as indicated above, it is common for die stacks to include 8 or more stacked semiconductor die. In such instances, each die in the stack may be wire bonded to the die directly below, or possibly two below. This configuration is shown in prior art FIGS. 3-4.

In the example shown in FIGS. 3 and 4, the stack includes three semiconductor die 22, 24 and 34, with each being bonded via wires 30 to the die below in the stack. The bottom die 22 may be wire bonded to the substrate 26. Moreover, the corresponding pins on the respective die are wire bonded together. Thus, the pin on die 34 is wire bonded to the first pin on die 24; the first pin on die 24 is in turn wire bonded to the first pin on die 22; and the first pin on die 22 is in turn wire bonded to the first finger on substrate 26. In FIG. 4, this is true for each corresponding pin across the die 34, 24 and 22.

While the above wiring configuration may be possible for data and control pins, wiring of the address pins of die in larger die stacks of greater than four die becomes more problematic. In addition to vertical wire bonds, wire bonds need to be made diagonally, and long jumps between two die that are spaced apart in the stack is required. One reason for this complication is the conventional stacking of die on the substrate in ascending numerical order, as explained in greater detail with respect to prior art FIG. 5. FIG. 5 is a schematic diagram of a typical NAND semiconductor die stack including eight die mounted to a substrate 26. Conventionally the die are stacked one atop another in an offset starting with die 0 and proceeding sequentially to die 7. FIG. 5 also shows the aligned rows of pins from each die, i.e., pins 19 through 23 (other pins not shown). Of these pins, pins 20, 21 and 23 are used chip address pins (CADD2$x$, CADD1$x$ and CADD0$x$) to identify each of the die 0-7 in the die stack.

For a given die in the stack, a low voltage to one of pins 20, 21, 23 represents a logical 0 and a high voltage to one of pins 20, 21, 23 represents a logical 1. Thus, using the three address pins on each die, each die in the conventional stack of FIG. 5 may be uniquely addressed sequentially from 000 (die 0) at the bottom of the stack through 111 (die 7) at the top of the stack. FIG. 5 also shows pin 19 which may be the power signal Vcc for each die 0-7, and pin 22, which may be a voltage monitor Vmon. Vmon may often be omitted or left open as shown (with no wire bond connections) in NAND semiconductor packages.

Address pins 20, 21, 23 on the respective die in the stack at a low voltage state may be electrically coupled together via groups of vertical and/or diagonal wire bonds, and then these groups of bonded pins may be bonded to ground contact pads on the substrate. Similarly, address pins 20, 21, 23 on the respective die in the stack at the high voltage state may be electrically coupled together via groups of vertical and/or diagonal wire bonds, and then these groups of bonded pins may be bonded to power contact pads on the substrate. This wire bonding must be accomplished in a way that prevents crossing of wires, which can result in an electrical short.

One drawback to wire bonding of larger die stacks having for example three address pins is that the bonding process is not carried out in a way that minimizes the length of wire required to accomplish all wire bonds. Often, after a first pass of making wire bonds, remaining pins need to be connected to each other that are spaced large distances from each other in the die stack. Such instances require long lengths of wire to make the connection. Wire bonds are typically formed of gold which is expensive. And it is not just the length of wire that is a problem. Longer bond wires are more prone to break, sag or short against adjacent bond wires. Thus, to provide the required rigidity, longer bond wires are made of thicker diameter material. Semiconductor packages are wire bonded using wire from a single spool. Thus, even if there are only a few longer connections that require a thicker diameter wire bond, that same diameter wire is used for all connections. Given the large number of wire bonds in each package, and the large number of fabricated packages, using more and thicker gold wire significantly adds to the cost of package fabrication.

Another problem with conventional wire bonded packages is that more than two ground and power contact pads are required to uniquely address the address pins in the stack. In prior art FIG. 5, a conventional eight die stack having three address pins CADD2$x$, CADD1$x$ and CADD0$x$ could require a total of six ground (GND) and power (PWR, Vcc) pins to connect the address pins to the substrate. Space on the substrate is at a premium, and it would be advantageous to connect to the address pins using less ground and power pins.

DESCRIPTION OF THE DRAWINGS

FIG. 5 is a schematic representation of a semiconductor stack including eight die in ascending numerical order

DETAILED DESCRIPTION

Embodiments will now be described with reference to FIGS. 6 through 23, which relate to rule-based methods of optimizing wire bonding jumps to minimize the amount of wire used for wire bonds and/or to minimize a number of power and ground pads on a substrate to support all wired connections. In general, the present technology teaches a method which wire bonds the low voltage pins to each other, and the high voltage pins to each other, using the shortest wire bond jumps. This minimizes the length of wire required to bond all pins. Moreover, as the lengths of all wire bond jumps in the stack are minimized, the diameter of the wire may also be minimized.

The method of the present technology further electrically couples all low voltage address pins across the die in the stack to each other, and electrically couples all high voltage address pins across the die stack to each other. Thus, all address pins across the stack may be supplied by a single ground contact and a single power contact on the substrate. This reduces the space on the substrate required for ground and power contact pads.

In embodiments, the present system optimizes the die ID ordering of a stack of devices and wire bonding of die on a substrate in a semiconductor package. The die may for example be NAND flash memory die, however, it is understood that the present technology may be used to optimize the ordering and wire bonding of other types of stacked semiconductor components, such as for example NOR type flash memory die, and DRAM, SDRAM and CMOS devices. The substrate may be any known type of substrate, such as for example a printed circuit board (PCB), a leadframe or a tape automated bonding (TAB) substrate. Embodiments are explained below with respect to an eight die stack. However, it is understood that the present technology may be employed for stacks that are less than eight die. The present technology may also have a particular advantage in setting the wire bonding layout for semiconductor die stacks having more than eight die.

It is understood that the present semiconductor device may be embodied in many different forms and should not be construed as being limited to the embodiments set forth herein. The terms "left" and "right," "top" and "bottom," "upper" and "lower," and derivations of these terms are used herein for convenience and illustrative purposes only, and are not meant to limit the description of the semiconductor device inasmuch as the referenced item can be exchanged in position.

Figure 1:
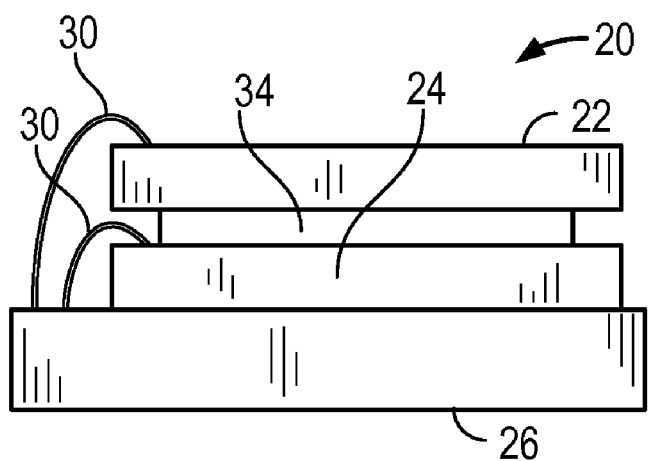
FIGS. 1 through 3 are prior art side views of different conventional semiconductor devices.
Figure 2:
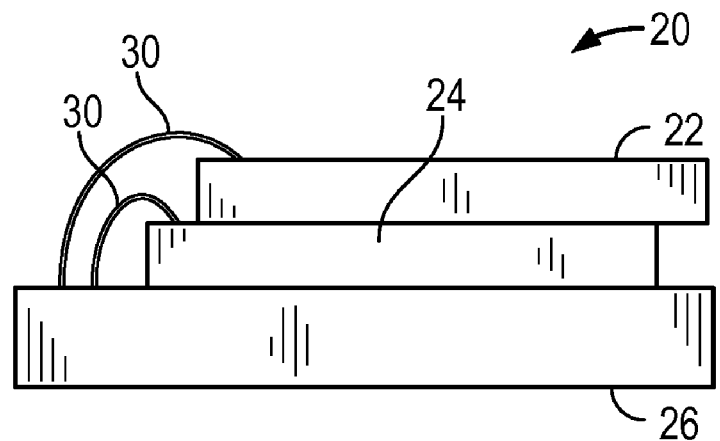
Figure 3:
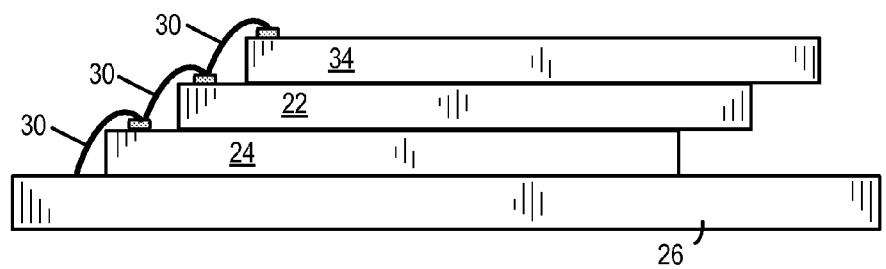
Figure 4:
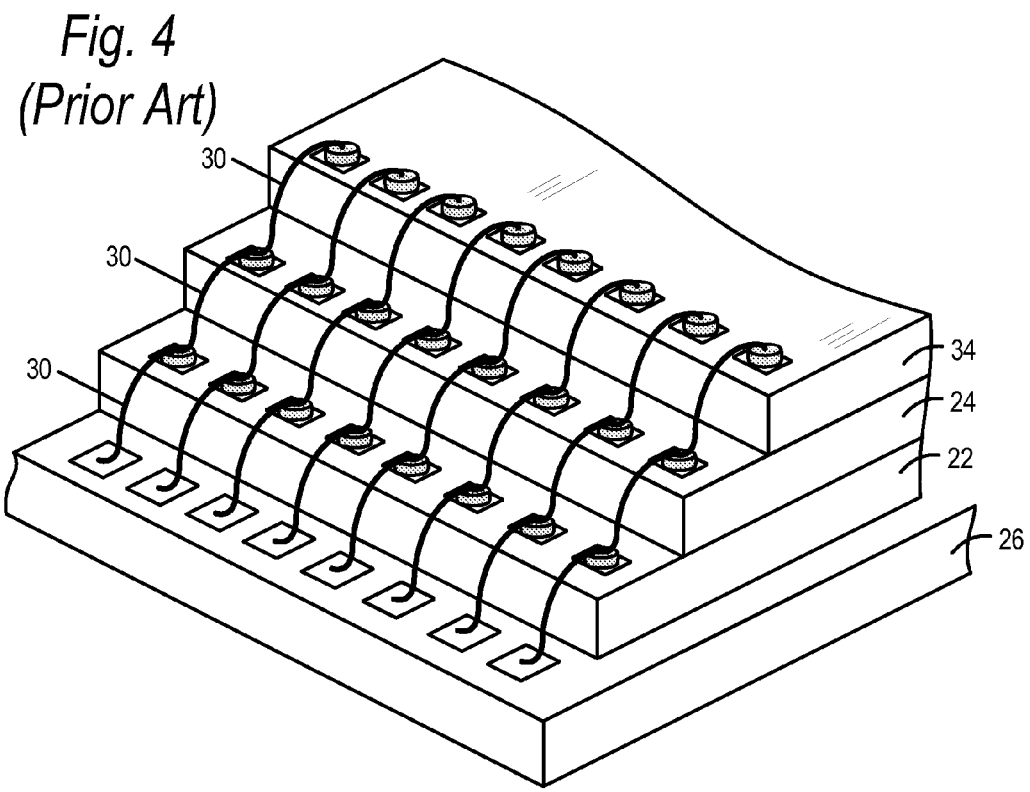
FIG. 4 is a perspective view of a semiconductor device showing the pins on each die in the die stack vertically bonded to aligned pins on adjacent die.
Figure 6:
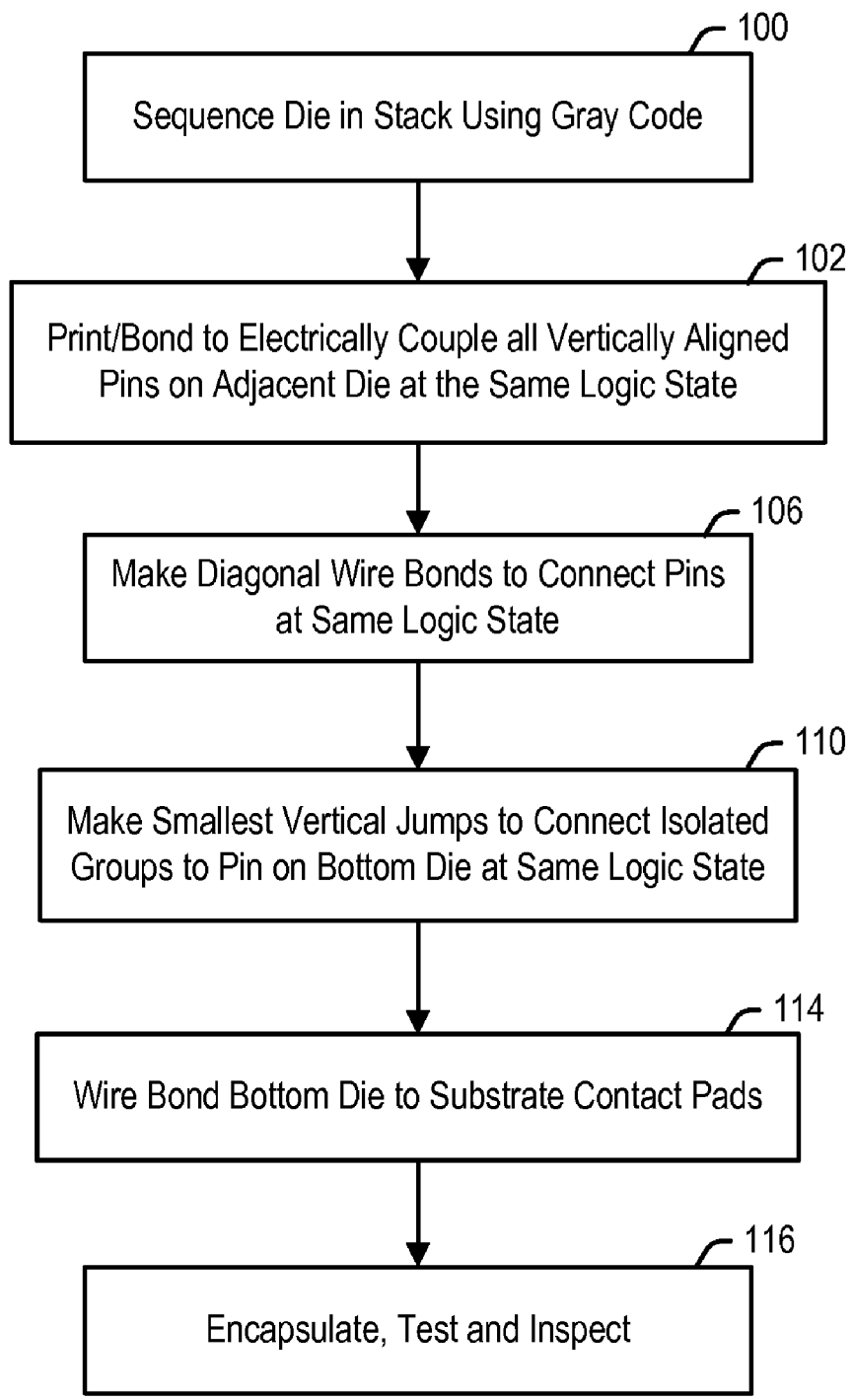
FIG. 6 is a high level flowchart of the operation of an embodiment of the present technology.

FIG. 6 is a high level flowchart of a method for optimized wire bonding according to an embodiment of the present technology. In step 100, the order of the die in the stack is determined. As explained in the Background section, this order was conventionally an ascending numerical ordering of the die, starting with die 0 at the bottom through die 7 at the top. Thus, the voltages to pins CADD2*x*, CADD1*x* and CADD0*x* were sequentially numbered from 000 to 111. In accordance with an aspect of the present technology, the die in the stack may be ordered using gray code instead of a simple ascending numerical ordering. Gray code is an ordered sequence of binary numbers, where the bits from one number to the next vary only in one bit. Thus, in a 3 bit gray code, element 0 (000) can be positioned next to element 1 (001) as the elements vary only in their least significant bit. However, element 1 (001) cannot be placed next to element 2 (010), as the elements vary in both of their last two bits.

Ordering the die in a die stack by gray code instead of the conventional ascending numerical order in part results in an optimized wire bonding pattern. Given the above disclosure to order die ID by gray code, those of skill will appreciate a wide variety of methods by which the gray code ordering of die ID may be set. In embodiments, the gray code stacking may be set in a known manner using a state machine and a Karnaugh map, so that the gray code stacking of the die has a reflexive property that makes it easy to add more address lines and bits, and a cyclical property (barrel shifting) that allows the starting number to be any number and the cyclical nature is preserved.

Figure 7:
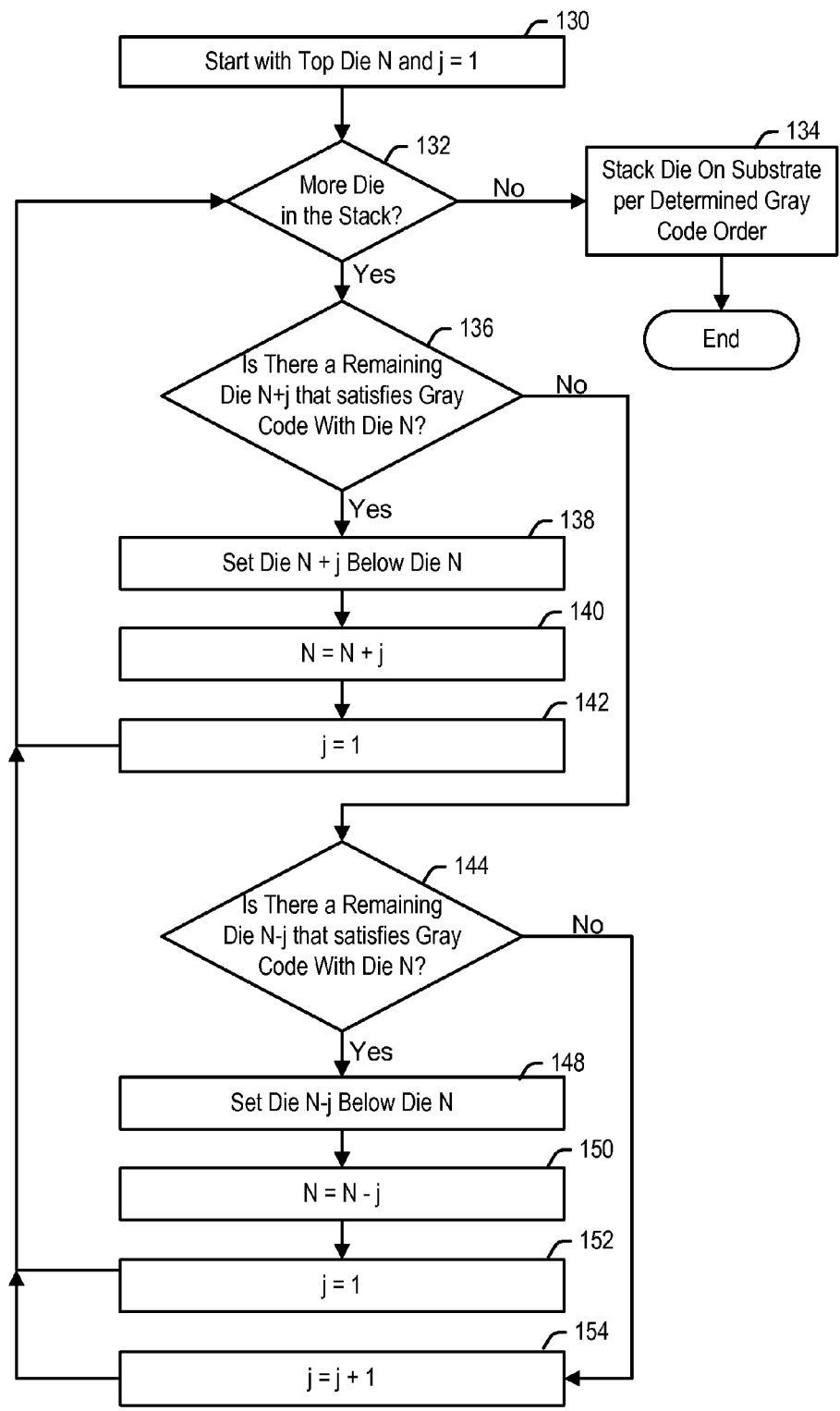
FIG. 7 is a flowchart for ordering die on the substrate using gray code per an embodiment of the present technology.

The flowchart of FIG. 7 shows one method of setting the order of die 0 through 7 in an eight die stack. In embodiments, the ordering of the die is set from the top of the stack down, and in embodiments, the top die on the stack starts with die 0. As indicated below, the ordering may start at the bottom, or at any position between the top and bottom, in further embodiments, and the stack need not start with die 0 in further embodiments. FIG. 7 is explained in detail below, but in general, a system operating by FIG. 7 starts with a given die ID number (N). The system will then stack the next die by looking for 1 die higher (N+1), then 1 die lower (N−1), then 2 die higher (N+2), then 2 die lower (N−2), etc. until it finds the next die that fits gray code and has not been used. The system continues stacking die until the order of all die in the stack are set.

In step 130, the system starts with the top die N, where N represents the decimal identity of a die. In an embodiment where die 0 is at the top of the stack, N=0 initially. Step 130 also initializes an arbitrary counter j to 1. In step 132, the system checks whether there are more die to place in the stack. The first time through the loop, there are more die to place on the stack. The system will pass through the loop eight times in an eight die stack until all die are assigned a position in the die stack. Once the positions of all eight die are set in step 132, the die may be stacked on the substrate in step 134 per the order set by the steps of FIG. 7. At that point, the operation of the present system to order die on the substrate ends.

Assuming there are more die to place in the stack in step 132, the system next checks in step 136 if there is a remaining die N+j that satisfies gray code with die N. Thus, where the first die is die 0 and j=1, N+j equals 1, and the system checks whether the binary representation of die 1 (001) satisfies gray code with the binary representation of die 0 (000). In this case, it does, so the position of die N+j is set below and directly adjacent the die N in step 138. N is incremented to N+j in step 140 and j is then reinitialized to 1 in step 142. The system then returns to step 136 for finding the next die in the stack.

If in step 136, there was not a remaining die N+j that satisfied gray code for the given values of N and j, the system jumps to step 144. For example, continuing with the above ordering of die, where N now equals 1 and j is reset to 1, the system checks whether die 2 (N+j) satisfies gray code with die 1. It does not, so the system would jump to step 144. In step 144, the system checks whether there is a remaining die N−j that satisfies gray code. Where N=1 and j=1, N−j=0. The position of die 0 is already set on the stack, so there is no such remaining die. The system thus jumps to step 154, increments j by 1, and returns to step 132 to check for more die left to be placed on the stack.

Continuing with the above example, there are more die in the stack, so the system moves to step 136 and again checks for a remaining die N+j that satisfies gray code. This time through N is still 1, but j=2, so the system checks whether die 3 (N+j) satisfies gray code with die N. Die 3 (011) does satisfy gray code with die 1 (001), so the position of die 3 is set to be placed directly below die 1 in step 138. N is set to die 3 in step 140, j is reinitialized to 1 in step 142, and the system returns to step 132.

The following time through the loop, there are still more die in step 132, so the system checks whether there is a remaining die N+j that satisfies gray code with die N. Die 4 (100) does not satisfy gray code with die 3 (011), so the system jumps to step 144 to check whether there is a remaining die N×j which satisfies gray code. Die 2 (N−j) still remains to be placed on the stack, and it satisfies gray code with die 3, so the position of die 2 is set directly below die 3 in step 148. N is set to N×j in step 150, and j is reinitialized to 1 in step 152. The system then returns to step 132 to check for more die on the stack.

The system continues through the above steps until the positions of all die in the stack have been set. For an eight die stack, the above steps shown in FIG. 7 will generate a sequencing of die in the stack as shown in Table 2.

TABLE 2

|  |  | Bottom of Stack | | | | | | Top of Stack | |
| --- | --- | --- | --- | --- | --- | --- | --- | --- | --- |
|  |  | Die 4 | Die 5 | Die 7 | Die 6 | Die 2 | Die 3 | Die 1 | Die 0 |
| Pin 20 | CADD2x | 1 | 1 | 1 | 1 | 0 | 0 | 0 | 0 |
| Pin 21 | CADD1x | 0 | 0 | 1 | 1 | 1 | 1 | 0 | 0 |
| Pin 23 | CADD0x | 0 | 1 | 1 | 0 | 0 | 1 | 1 | 0 |

As seen, each die in the stack, top to bottom, has a binary number for the three address pins which varies by a single bit from the die above and below it. Given the above disclosure, those of skill in the art will appreciate variations to the steps 130 to 154 described in FIG. 7 to provide other gray code sequencing of the die in the die stack. Tables 3 and 4 illustrate other sequencing of die in the stack which satisfy gray code and could be used in further embodiments. It is noted that the stacking in Table 3 is cyclical (barrel shifting) in that the die 0 at the top of the stack satisfies gray code with the die 1 at the bottom die in the stack (the same is true for Table 2). Table 4 is an example which is not cyclical, but still may be used in further embodiments.

TABLE 3

|  |  | Die 1 | Die 3 | Die 2 | Die 6 | Die 7 | Die 5 | Die 4 | Die 0 |
|---|---|---|---|---|---|---|---|---|---|
| Pin 20 | CADD2x | 0 | 0 | 0 | 1 | 1 | 1 | 1 | 0 |
| Pin 21 | CADD1x | 0 | 1 | 1 | 1 | 1 | 0 | 0 | 0 |
| Pin 23 | CADD0x | 1 | 1 | 0 | 0 | 1 | 1 | 0 | 0 |

TABLE 4

|  |  | Die 7 | Die 3 | Die 1 | Die 5 | Die 4 | Die 6 | Die 2 | Die 0 |
|---|---|---|---|---|---|---|---|---|---|
| Pin 20 | CADD2x | 1 | 0 | 0 | 1 | 1 | 1 | 0 | 0 |
| Pin 21 | CADD1x | 1 | 1 | 0 | 0 | 0 | 1 | 1 | 0 |
| Pin 23 | CADD0x | 1 | 1 | 1 | 1 | 0 | 0 | 0 | 0 |

Those of skill in the art will understand that larger and smaller die stacks may have the die sequenced by gray code according to the flowchart of FIG. 7 or by other embodiments.

As indicated above, the system may not start with die 0 at the top, but may instead start with any die in the stack in further embodiments. The steps of FIG. 7 may describe an embodiment for ordering such die. Table 5 shows a die ordering where die 3 was, for example selected as the uppermost die in the stack.

TABLE 5

|  |  | Die 2 | Die 0 | Die 1 | Die 5 | Die 4 | Die 6 | Die 7 | Die 3 |
|---|---|---|---|---|---|---|---|---|---|
| Pin 20 | CADD2x | 0 | 0 | 0 | 1 | 1 | 1 | 1 | 0 |
| Pin 21 | CADD1x | 1 | 0 | 0 | 0 | 0 | 1 | 1 | 1 |
| Pin 23 | CADD0x | 0 | 0 | 1 | 1 | 0 | 0 | 1 | 1 |

Given the above disclosure, those of skill in the art will appreciate that other die may be at the top of the stack and that the die may then be ordered per gray code.

Embodiments of the present technology use gray code sequencing of the die to provide wire bonding efficiencies as explained below. However, alternative embodiments of the present technology may stack die using conventional ascending numerical ordering instead of gray code, and still result in wire bonding efficiencies over conventional wire bonding techniques as explained below.

Returning to the high level of FIG. 6, after the order of the die in the die stack is set as described above, a wiring method according to a further aspect of the present technology is applied in steps 102 through 110. In particular, these wiring steps optimize the wire bonding of pins to ensure that the wire bonding is accomplished using the least amount of wire bonding steps and a minimum number of power and ground pads on the substrate.

Figures 8, 9:
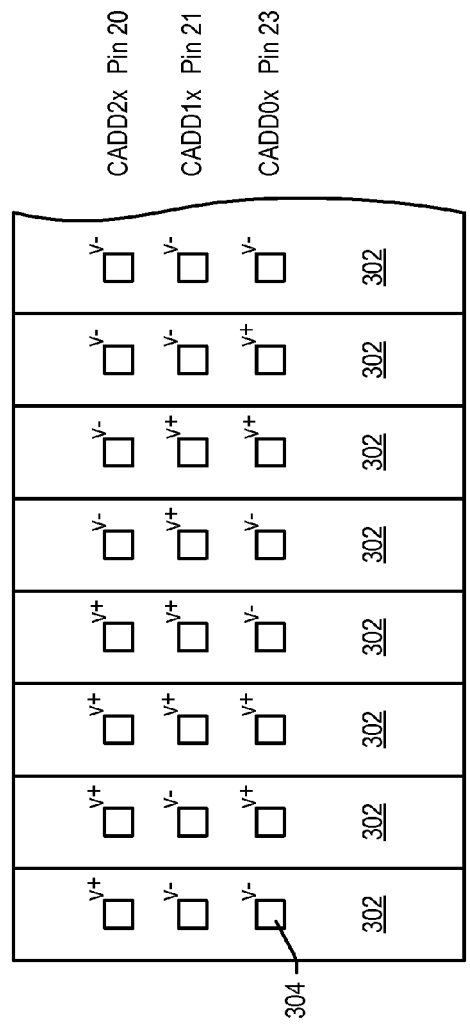
FIG. 8 is a schematic layout of a die stack ordered per the flowchart of FIG. 7.
FIG. 9 is a top view of a die stack ordered per the flowchart of FIG. 7.

Referring to FIG. 8, there is shown a die sequence as determined by the flowchart of FIG. 7, including a die stack with die ordered top to bottom: 0-1-3-2-6-7-5-4. FIG. 9 shows a top view of a die stack 300 including die 302 ordered per the table of FIG. 8. Each die 302 includes a plurality of pins 304 (one of which is numbered in FIG. 9). Pins of a like voltage state (also called logic state herein) are bonded together according to aspects of the present technology. In FIG. 9, all those pins 304 tied to a low voltage state ("v−") can be bonded together, and all those pins 304 tied to a high voltage state ("v+") can be bonded together. The voltage state across the three address pins on each die 302 are used to uniquely identify each die in the stack.

Figure 11:
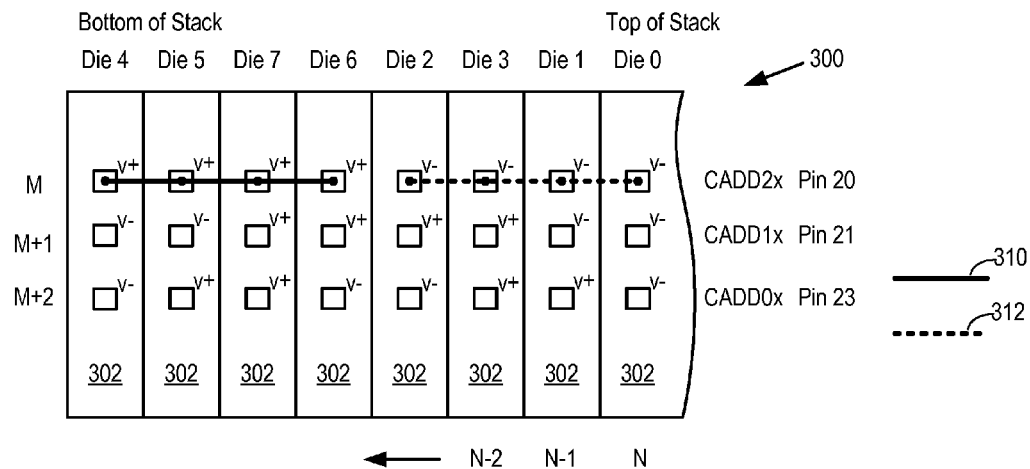
FIG. 11 is a top view of a die stack having single hop vertical jumps made during the process shown in the flowchart of FIG. 10.
Figure 12:
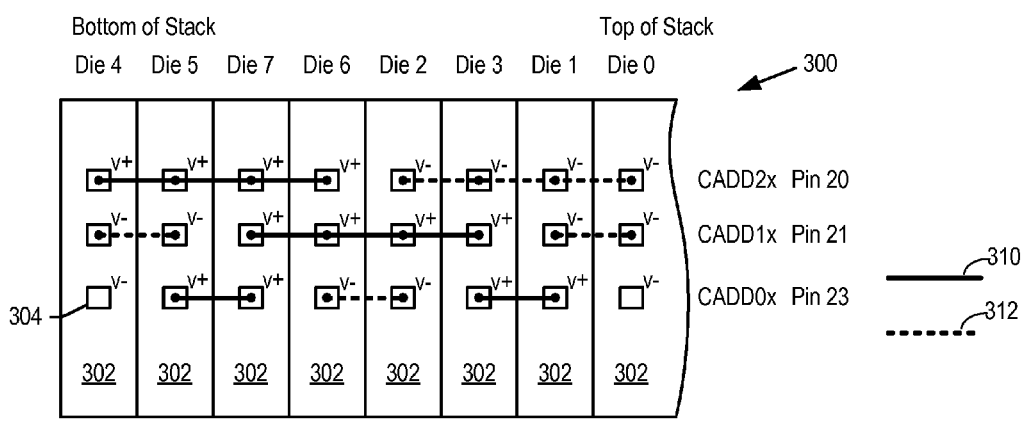
FIG. 12 is a top view of a die stack having single hop vertical jumps made upon completion of the process shown in the flowchart of FIG. 10.

In a step 102 on the high level flow diagram of FIG. 6, a first step in the wiring of like voltage state pins 304 across the die stack 300 (FIG. 9) is to make "single hop" vertical wire bonds between pins 304 at like voltage state from one die to the next. The term "single hop" refers to the fact that a wire bond goes only between adjacent die, as opposed to a multiple hop, where a wire bond may be made between non-adjacent die. The term "vertical" refers to the fact that the wire bond goes between vertically aligned pins, as opposed to diagonal wire bonds described hereinafter. The steps to bond vertically aligned pins will now be described in greater detail with respect to the flowchart of FIG. 10 and the top views of FIGS. 11 and 12. As explained below, FIG. 11 shows the vertical wire bonds that are set about one-half way through the vertical wire bond process, and FIG. 12 shows the completed wire bonds made in the vertical wire bond process.

Conceptually, the pins 304 in the die stack 300 may be thought of as an N×M array, where N represents the number of die 302 in the stack, and M represents the number of address pins on each die. The wire bonding process may begin with the uppermost die and work downward. In this context, N does not represent the decimal value of the actual die ID (as it did in FIG. 7), but is instead a sequential numbering from the top die (N=7 in an eight die stack) down to the bottom die (N=0).

M can be initialized to start with any arbitrary pin number. In one embodiment, the vertical wire bonding of FIGS. 10 through 12 may begin with the most significant bit address pin. In a three bit address stack, this may be CADD2x (M=Pin 20). In steps 160 and 162 (FIG. 10), the process begins with initializing M to the starting pin number, and initializing N to the number of die in the stack. As both N and M are counters, they may be set to arbitrary values with the upper, right pin (from the perspective of FIG. 10) assigned the starting (N, M) values. As explained hereinafter, the system need not start at the upper right pin in further embodiments.

In step 168, the system checks whether pin (N, M) has a pin (N−1, M) of a like state that it can connect to. Conceptually, the system is looking for a pin on a first die N that is a "single hop" from an aligned pin of like state on a second die N−1 right below die N.

If step 168 determines that pin (N, M) has a pin (N−1, M) of a like state that it can connect to, that connection is set in step 170. In embodiments, all one hop vertical connections are first determined, and then actually wire bonded in a final step 184. In further embodiments, these wire bonds may be made when they are set. If step 168 determines that pin (N, M) does not have a pin (N−1, M) of a like state that it can connect to, step 170 is skipped, and the system checks if N=0, indicating that it is examining the bottom die. Assuming it is not examining the bottom die, N is decreased by 1 to examine the next lower die in the stack, and the system returns to step 162 to see if there are any other adjacent die in the row of pins of like voltage state that can be vertically wire bonded together with a single hop.

If N equal 0 in step 172, the system then checks whether there are more address rows to examine. If there are more rows to examine, M is incremented in step 182, N is again reinitialized to its start value in step 162, and the system checks for wire bonds in the new row in steps 168 through 172 as described above. If all rows have been examined so that M is at the last row (highest pin number) for all rows being wire bonded per the present technology, the system can make all the wire bonds in step 184. In an alternative embodiment where pins are wired and they are set as described above, step 184 may be omitted.

The top view of FIG. 11 shows the above process partially completed. The system begins with the pin 20 in the top die 0. The system identified that the pins on the top four die (0-1-3-2) were all of a low voltage state, so it set those to be connected. It determined that the pins in row 20 between die 2 and die 6 were not of like state, so no connection was made, and then it determined that the pins on the bottom four die (6-7-5-4) were all of a high voltage state, so it set those to be connected. In the figures, solid lines 310 represent connections between high voltage state pins and dashed lines 312 represent connections between low voltage state pins. FIG. 12 shows the die stack 300 after all of steps 160-184 have been completed, with all vertical, single hop connections made that are possible.

In embodiments, vertical, single hop connections may be made with a low profile, narrow diameter wire bond. In further embodiments, it may be possible to digitally print the vertical, single hop electrical connections, using a wire bonding device analogous to a digital ink jet printer. Additional details of such a wire bonding system for printing vertical, single hop electrical connections is disclosed for example in U.S. Pat. No. 6,501,663, entitled, "Three Dimensional Interconnect System," which patent is incorporated herein by reference in its entirety.

Given the above disclosure, those of skill in the art will appreciate variations which may be made without departing from the present technology. For example, instead of starting with the top die, one hop vertical bonding per the present technology could alternatively be accomplished starting with the bottom die and working up in the same manner. Similarly, instead of starting with the starting pin/row number, the present technology could start with the ending pin/row number and work backwards. It is further contemplated that the process may be initiated somewhere in between the top and bottom die, and/or in between the starting and ending pin/row, and completed per the present technology.

Figure 14:
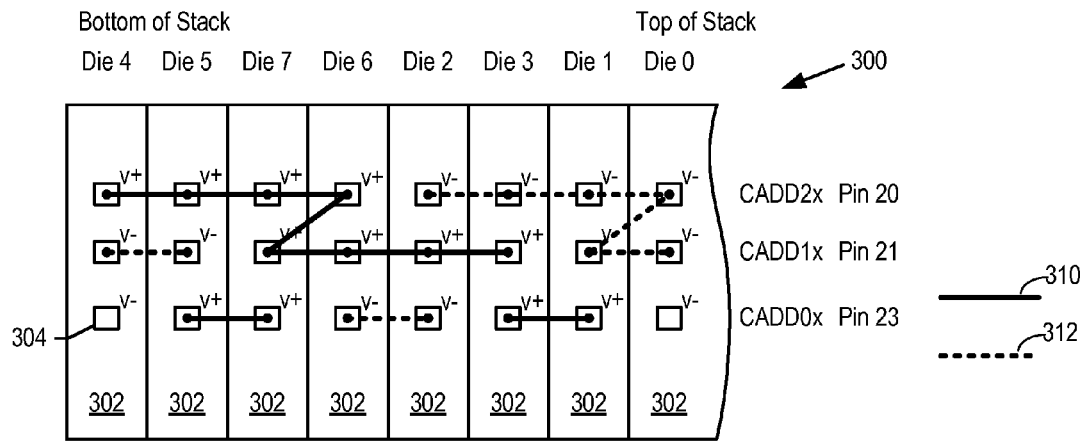
FIG. 14 is a top view of a die stack having diagonal jumps made during a first portion of the process shown in the flowchart of FIG. 13A.
Figure 15:
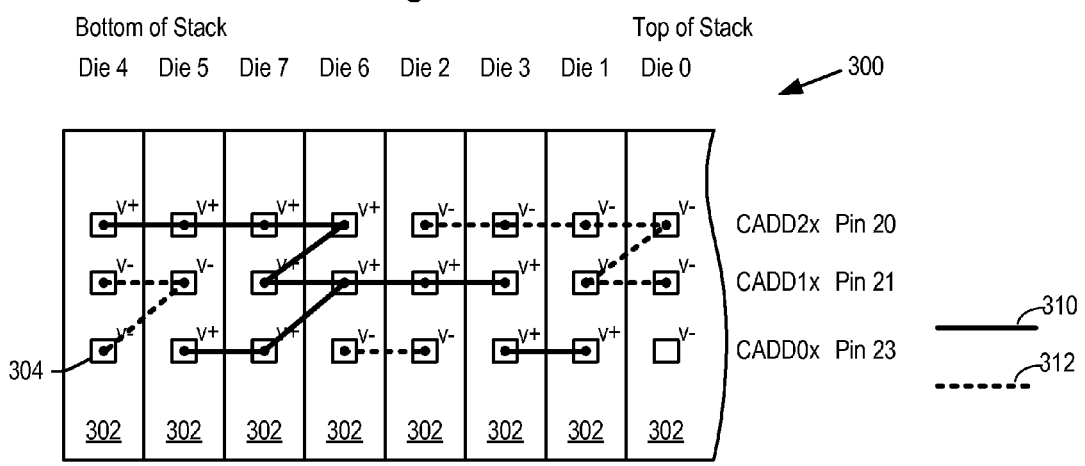
FIG. 15 is a top view of a die stack having diagonal jumps made during a second portion of the process shown in the flowchart of FIG. 13A.
Figure 16:
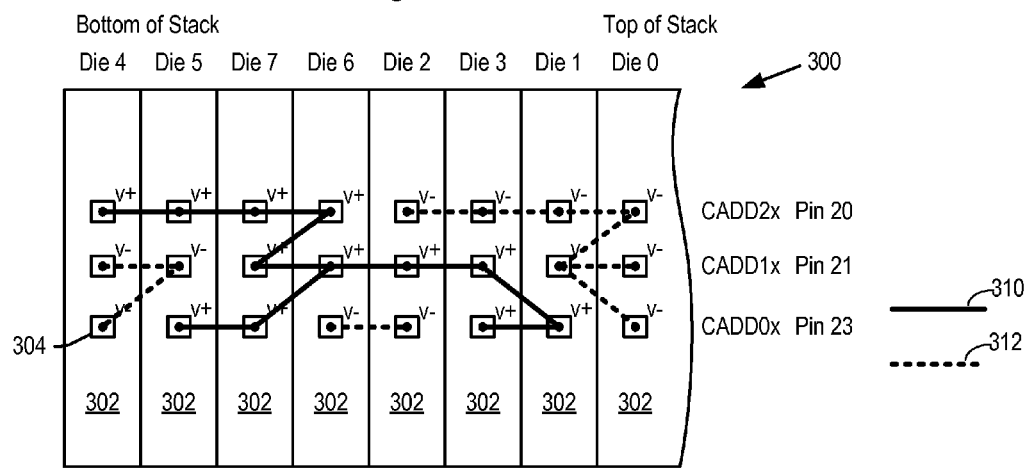
FIG. 16 is a top view of a die stack having diagonal jumps made upon completion of the process shown in the flowchart of FIGS. 13A and 13B.
Figure 17:
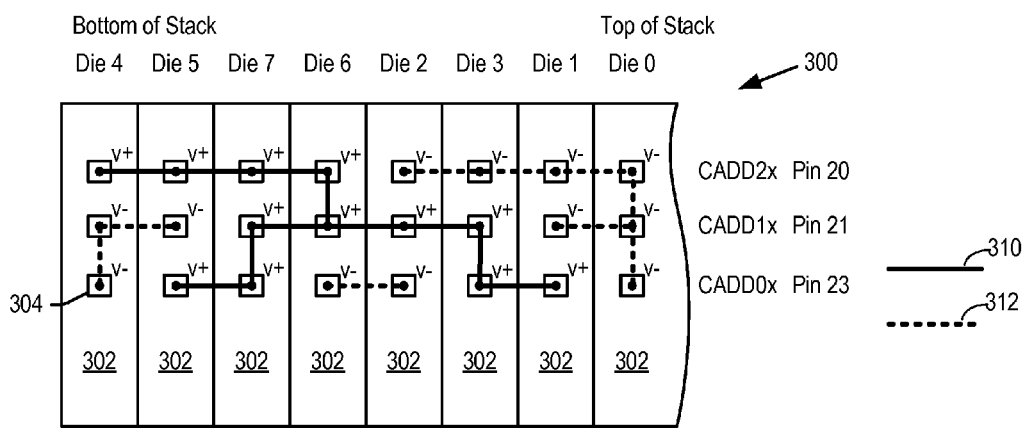
FIG. 17 is a top view of a die stack having horizontal jumps as an alternative embodiment to the diagonal jumps of FIGS. 14-16.

Returning to the high level flowchart of FIG. 6, once all vertical, single hop electrical connections are made, the system next makes diagonal electrical connections between pins at like voltage states in different rows in step 106. The steps for making diagonal connections will now be described in greater detail with respect to the flowchart of FIGS. 13A and 13B and the top views of FIGS. 14 through 17. As explained below, FIGS. 14 through 16 show diagonal bonds that are set as the system works through the flowchart of FIGS. 13A, 13B. FIG. 17 shows the die stack 300 after all of steps 190-248 have been completed, with all diagonal hop connections made that are possible.

Figure 10:
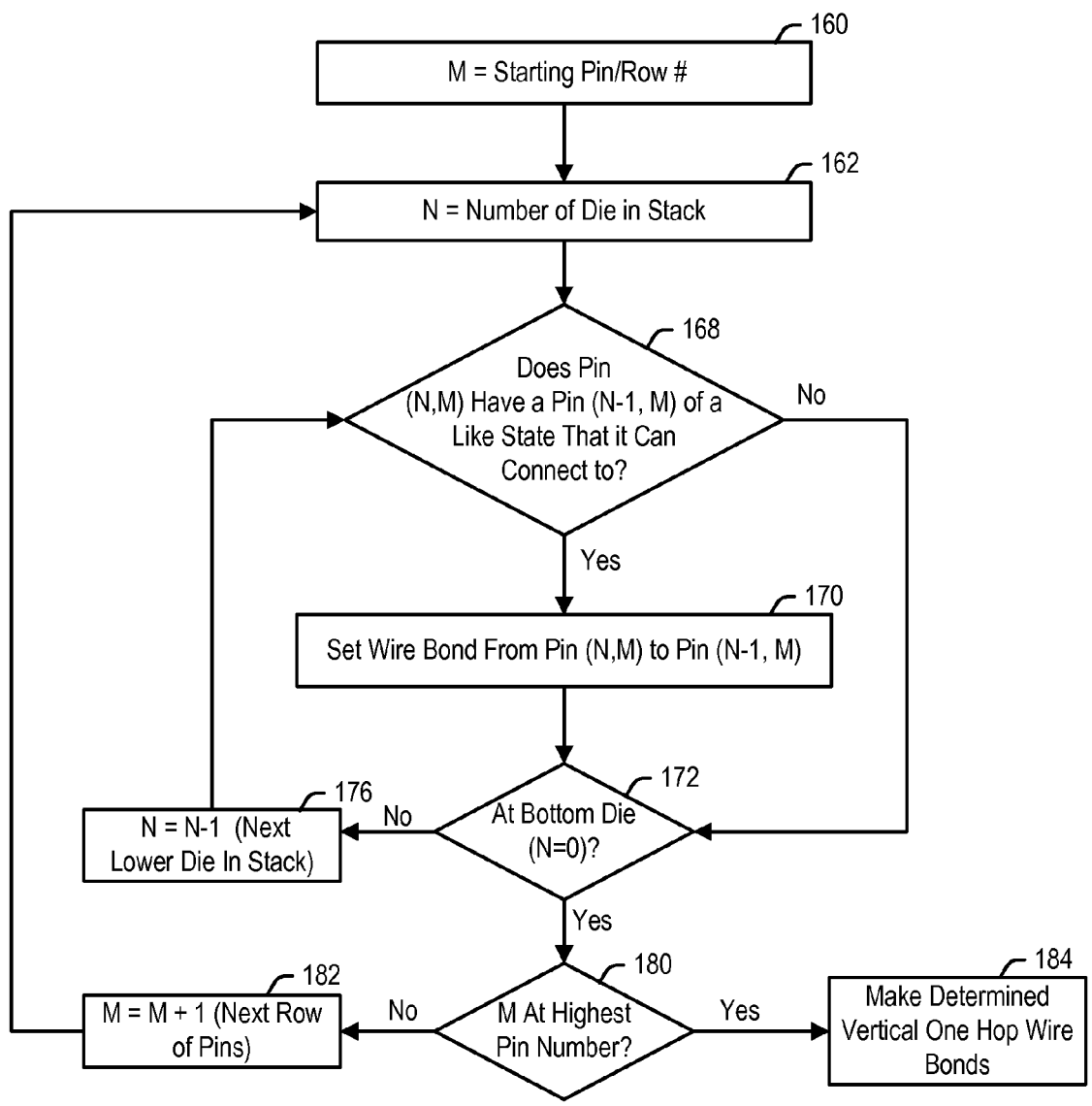
FIG. 10 is a flowchart for making single hop vertical jumps during the wire bonding process of an embodiment of the present technology.
Figure 13A:
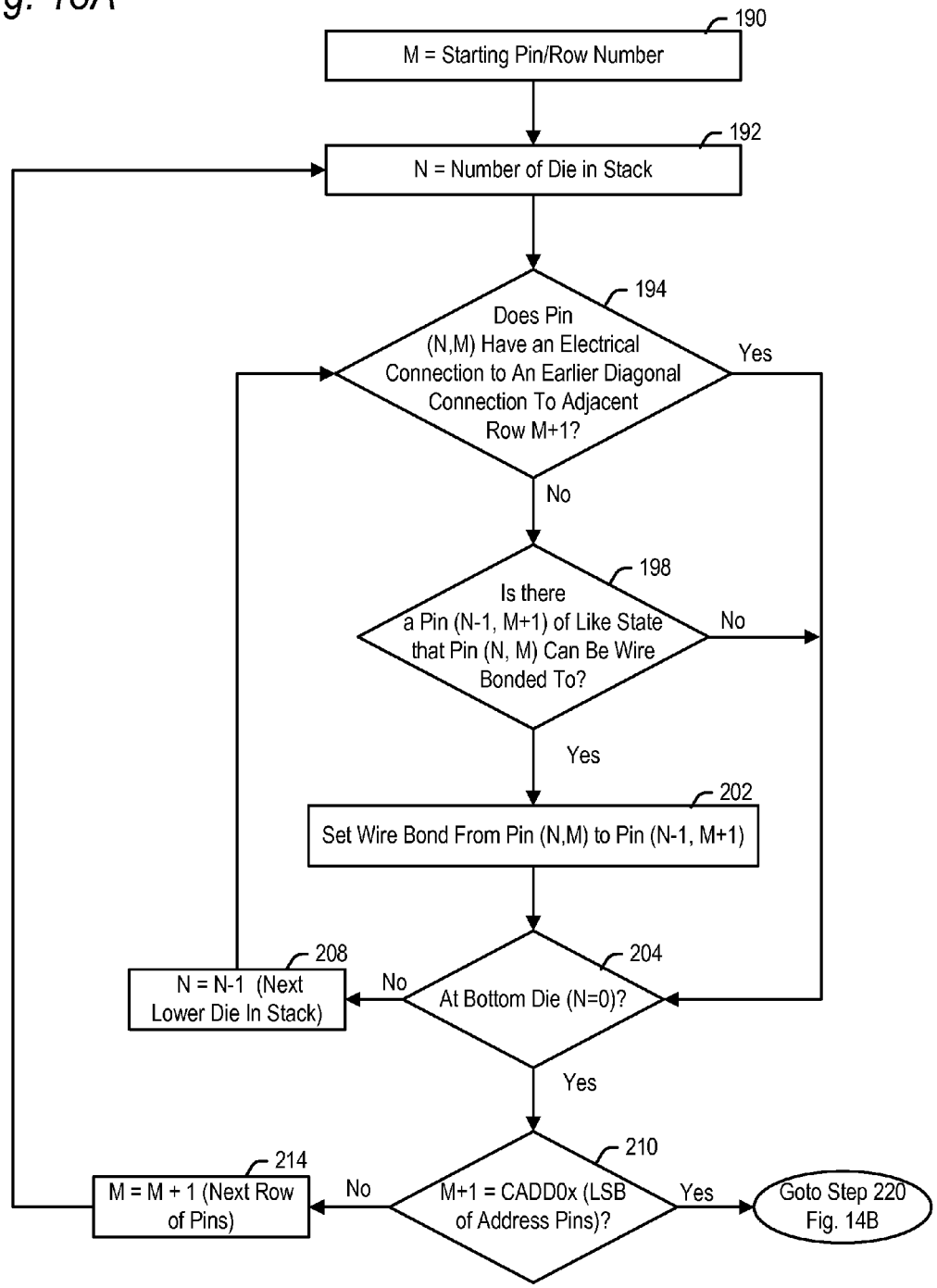
FIGS. 13A and 13B are a flowchart for making diagonal hops during the wire bonding process of an embodiment of the present technology.
Figure 13B:
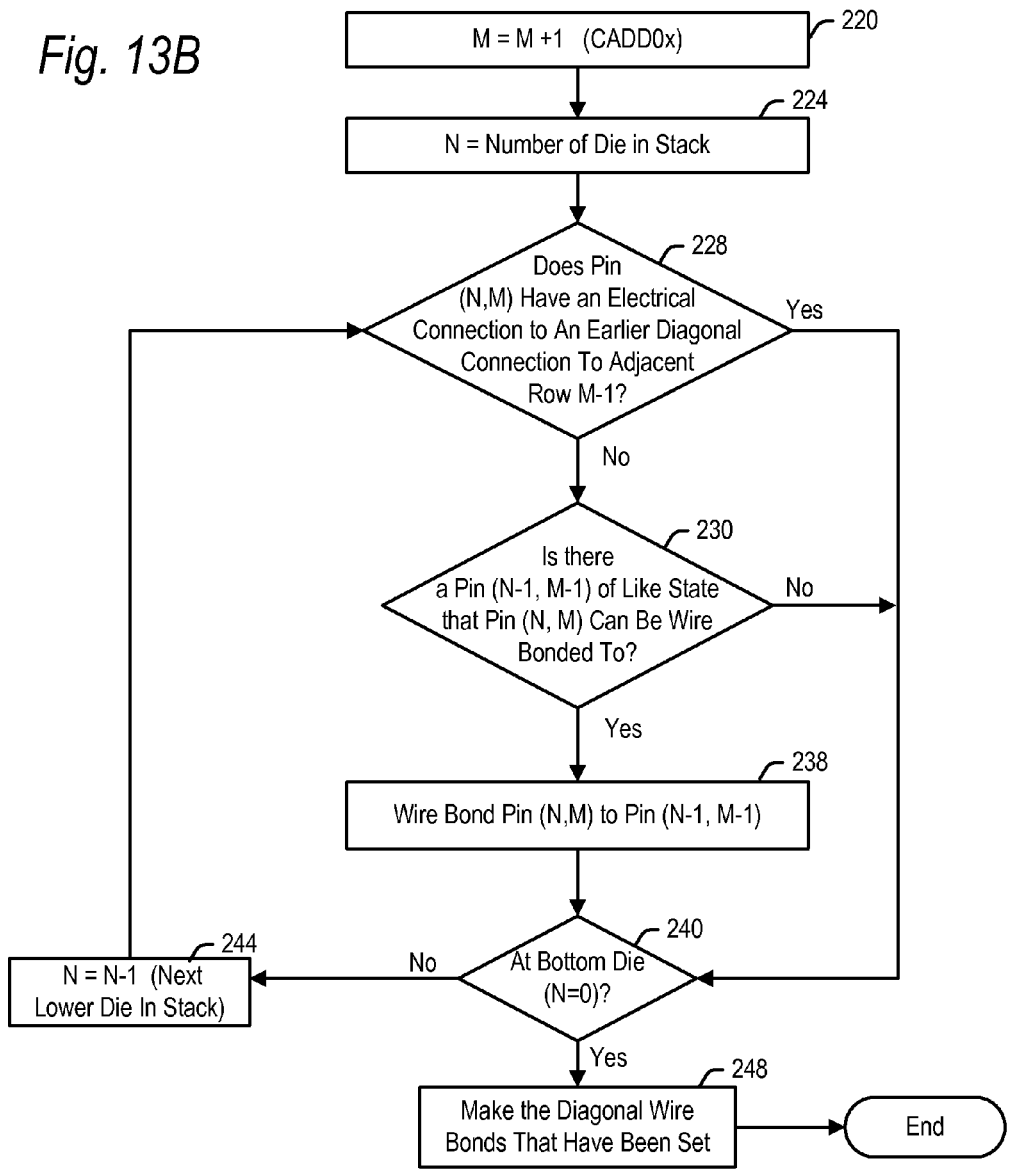

The flowchart of FIGS. 13A and 13B may use the same N×M array described for FIG. 10, where N is the number of die in the stack, and M is the starting number of the pins/rows to which wire bonds are to be applied according to the present technology. In steps 190 and 192, the process begins with initializing M to the starting pin number, and initializing N to the number of die in the stack. As above, both N and M are counters, and they may be set to arbitrary values with the upper, right pin (from the perspective of FIG. 14) assigned the starting (N, M) values. As explained hereinafter, the system need not start at the upper right pin in further embodiments.

In step 194, the system checks whether pin (N, M) has an electrical connection to an earlier diagonal connection from the adjacent row M+1. If so, another electrical connection from pin (N, M) would be redundant, and the system skips to step 204 explained below.

In step 198, the system checks whether there is a pin (N−1, M+1) of like voltage state that pin (N, M) can be wire bonded to. Conceptually, the system is looking for like voltage state pins that are diagonally one die lower and one pin higher. If there are none, the system skips to step 204 explained below.

If, however, step 194 shows a connection would not be redundant, and step 198 shows there is a diagonal connection to a like pin one die down and one pin higher, that wire bond is set in step 202. In embodiments, diagonal bonds may be overridden and changed as the process proceeds, so in embodiments, the actual wire bonds are not made until all diagonal wire bonds are set. In further embodiments however, overriding of wire bonds may be omitted, and wire bonds may be made in step 202 in addition to just identifying the wire bond.

In step 204, the system checks whether the bottom die is being examined. If not, N is decreased by 1 to examine the next lower die in the die stack, and the system again performs steps 194 through 202. If, on the other hand, the system determines that it is the bottom die that is being examined, the system next checks whether the next row is the least significant bit (LSB) address row, CADD0$x$, in embodiments where the LSB address row is the last row to be wire bonded per the present technology. In particular, in embodiments, the rows above the last row look to bond to a lower row (that is, a given row number looks to bond to the next higher row number).

However, if the system is at the lowest row to be examined, it looks to bond to the next higher row (lower row number). The steps used at the lowest row are explained below with respect to steps 220 through 244 in FIG. 13B. On the other hand, if step 210 determines that the next row is not the last row to be examined, M is increased to the next row in step 214, N is again initialized to the number of die in the stack, and steps 194 through 210 are repeated.

The above steps 190 through 214 are now explained with reference to the top views of the die stack 300 shown in FIGS. 14-15. FIG. 14 shows the electrical connections that would be made in the first row M. The system starts with pin 20 on die 0. The first pin has no earlier diagonal connections in the row, and it has a like pin at (N−1, M+1). So the connection is set in step 202. No other pins meet this criteria until the pin 20 on die 6. The connection of that pin to pin 21, die 7 is set. No other pins in the second row meet the criteria of steps 194 and 198, so at step 204 (bottom die), the system checks whether there are more rows before the final row (step 210). There are (row 21), so the system increases M to the next row, reinitializes N to the top die, and returns to step 192.

FIG. 15 shows the electrical connections that would be made from row 21. The electrical connections that are being made are to row 23, skipping over row 22, Vmon (not shown), in embodiments where Vmon exists between address pins CADD1$x$ (pin 21) and CADD0$x$ (pin 23). In row 21, only the pins at die 6 and die 5 satisfy the criteria of steps 194 and 198. The pin 21, die 6 is set for connection to pin 23, die 7, and the pin 21, die 5 is set for connection to pin 23, die 4. The system next looks to make diagonal connections from the bottom row as explained below.

Referring again to the flowchart of FIGS. 13A and 13B, if the system determines in step 210 that the next row is the bottom row to be wired per the present technology (row 23 in this example), the system then performs step 220 of FIG. 13B. In that step, M is incremented to the final row, and N is again initialized to the number of die 302 in the stack 300 in step 224. In step 228, the system checks for an earlier diagonal connection to the row above which would make a connection from the current die N redundant. This is the same as in step 194 above, but as it is in the bottom row, the system looks to the next higher row (next lower M−1) instead of looking to the next lower row). It is understood that where Vmon pin 22 exists between the address pin CADD0x pin 23 and CADD0x pin 21, step 228 may skip over the Vmon pin and look for a previous connection to pin 21.

In step 230, the system checks whether there is a pin (N−1, M−1) of like voltage state that pin (N, M) can be wire bonded to. This step is similar to step 198 above, but as it is in the bottom row, the system looks to the next higher row (next lower M) instead of looking to the next lower row. Again, where Vmon pin 22 exists between the address pin CADD0x pin 23 and CADD0x pin 21, step 230 may skip over the Vmon pin and look for a like connection to a pin 21.

If there is no connection to a like (pin N−1, M−1), the system skips to step 240 described below. Otherwise, if a pin (N, M) meets the criteria of steps 228 and 230, a diagonal bond from pin (N, M) is set in step 238. In step 240, the system checks for additional die in the stack. If there are such die, the system decreases N to the next die in the stack, and the system repeats steps 228 to 240 for the next die in the stack. On the other hand, if the system has progressed to the bottom die in the last row, the system is finished setting wire bonds. These bonds may be made in step 248 (assuming they are not made as they are set), and the diagonal wire bond process ends.

The steps 220 through 248 for wire bonding the final row are shown in FIG. 16. Upon examining the top die 0 in the last row 23, that pin is not coupled to an earlier pin making a diagonal connection, and it has a pin (N−1, M−1) of like state to connect to at die 1, row 21. That connection is set in step 238. These steps are repeated for the pin 23 at die 1, resulting in the final diagonal connection from that pin to pin 21, die 3. There are no other pins 23 in the row that satisfy the criteria of steps 228 and 230, so all connections are made in step 248, and the diagonal wire bond process concludes.

Given the above disclosure, those of skill in the art will appreciate variations which may be made without departing from the present technology. For example, instead of starting with the top die, diagonal bonding per the present technology could alternatively be accomplished starting with the bottom die and working up in the same manner. Similarly, instead of starting with the starting pin/row number, the present technology could start with the ending row number and work backwards. It is further contemplated the process may be initiated somewhere in between the top and bottom die, and/or in between the starting and ending row, and completed per the present technology.

Moreover, instead of bonding down and to the left with respect to the view of FIGS. 14-16, diagonal bonding may be done down and to the right, up and to the left (after the first row) or up and to the right (after the first row). Further alternatives will be understood given the above disclosure.

In a further embodiment, digital printing techniques can be used to replace at least some of the diagonal wire bonds. In particular, as discussed above, digital printing of electrical connections may be used to establish single hop vertical connections. In further embodiments, digital printing of electrical connections may be used to make horizontal connections between pins on the same die of like state. An example of an eight die package wired in accordance with this embodiment are shown in FIG. 17. In this embodiment, all diagonal wire bonds are replaced with horizontal electrical connections between pins of like state on the same die that are one hop away. Those horizontal single hop connections may be made by digital printing. In further embodiments, the horizontal single hop connections between pins of like state may be done using a wire bond. Given the above disclosure, those of skill will appreciate how the flowchart of FIGS. 6 and 13A, 13B may be modified to perform the horizontal single step electrical connections in accordance with this alternative embodiment.

Returning to the high level flowchart of FIG. 6, the next step 110 in the bonding process involves connecting any isolated groups of like logic state to the bottom die using multiple hop vertical connections. An "isolated group" is a group of electrically connected pins of like voltage state that have no electrical connection to a pin on the bottom die. It is a feature of sequencing the die using gray scale and setting the top die as die 0 that the high voltage state connections will all be connected and have a connection to the bottom die. However, some of the low voltage state connections may be isolated. It is a further feature of sequencing the die using gray scale and setting the top die as die 0 that the shortest connections to connect all isolated groups to the bottom die can all be made from the LSB address pins, i.e., CADD0x, and the hop will be a vertical hop of three die. Thus, in embodiments, all multiple hop vertical connections are made vertically along the LSB address pin, as described in greater detail with respect to the flowchart of FIG. 18 and the top view of FIG. 19.

Figure 18:
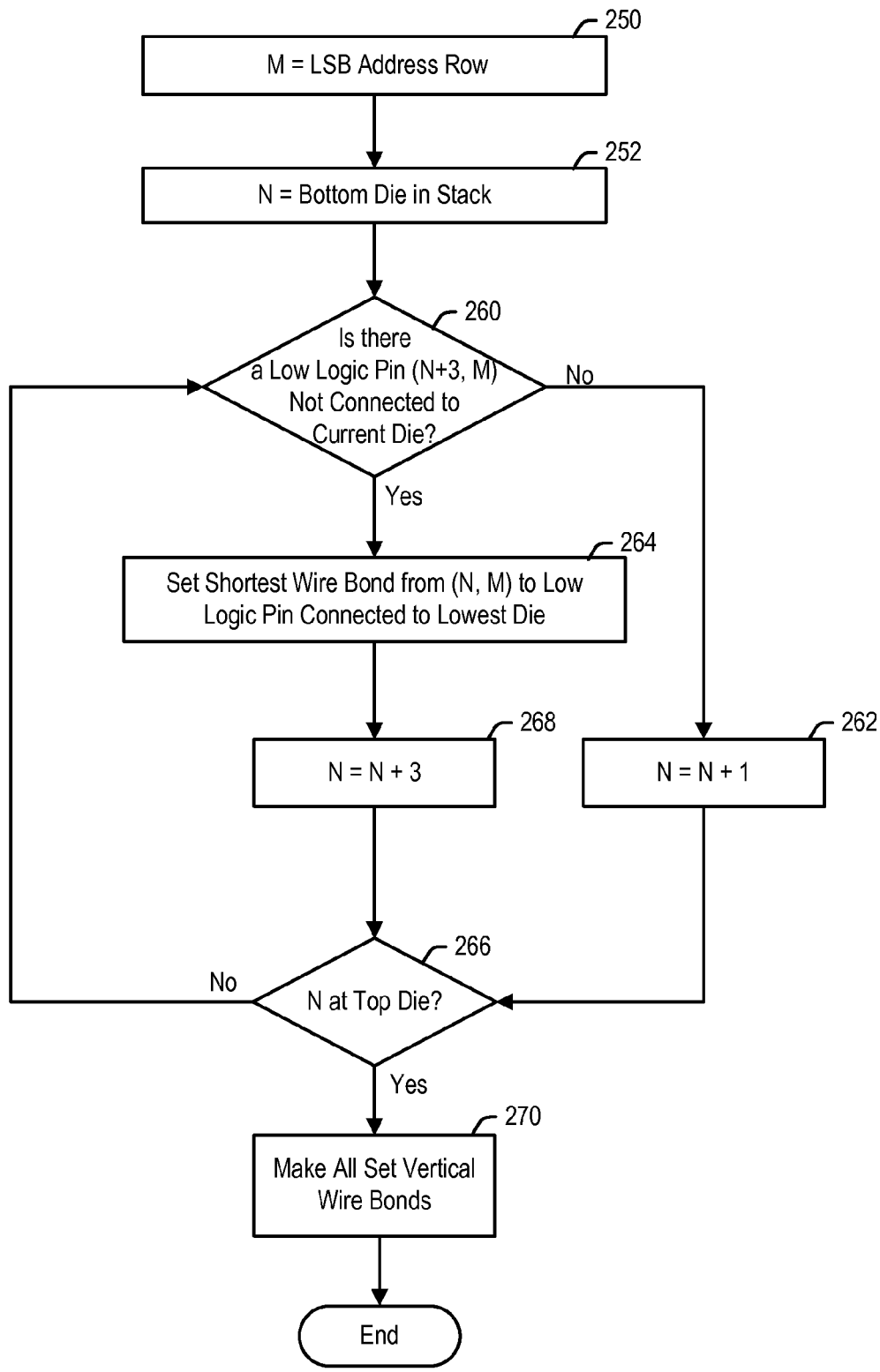
FIG. 18 is a flowchart for making multiple hop vertical jumps for wire bonding isolated groups of low voltage state pins together.

In the flowchart of FIG. 18, the multiple hop, vertical bonding of isolated low logic state pins begins with initializing M to the LSB address pin in step 250, and initializing N to the bottom die (N=0). The system then checks for a pin that is three die away (N+3) that is not connected to the bottom die (or a die connected to the bottom die) in step 260. If no such die is found, N increments by 1 to the next higher die in the stack (step 262), and a check is made in step 266 whether the system is at the top die. If not, the system returns to step 260 to look at the next higher die in the stack.

If, on the other hand, a die N+3 is found that is not connected to die N, a bond is set between the LSB pins of die N and N+3 in step 264. Again, the check of N+3 is made because it is known, using gray code with die 0 at the top of the stack, that isolated groups that may exist will be separated by 3 die. N is incremented by three in step 268 to the die that was just connected (directly or indirectly) to the bottom die. And the system performs step 266 to check whether the system is at the top die as described above. Once N has incremented to the top die, all vertical wire bonds would have been made and no pin groups would remain isolated. In step 270, the system makes the vertical wire bonds set in step 264, and the wire bonding between die 302 in the die stack ends.

Figure 19:
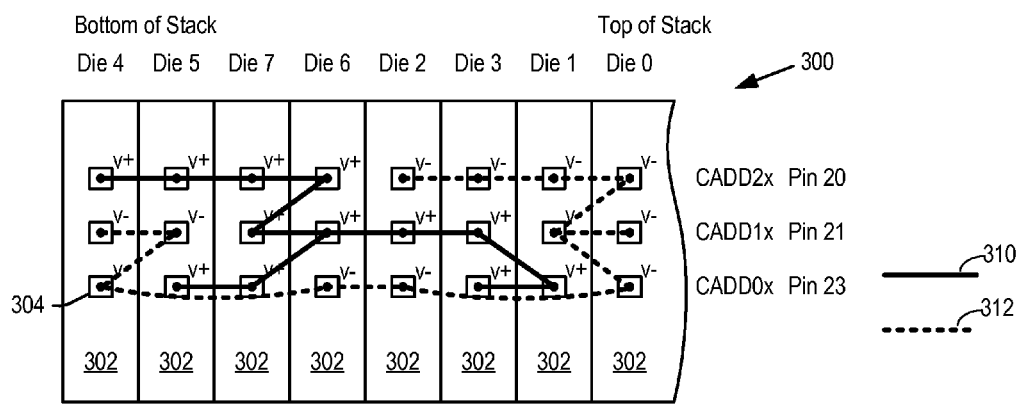
FIG. 19 is a top view of a die stack having multiple hop vertical jumps made upon completion of the process shown in the flowchart of FIG. 19.

FIG. 19 shows a top view of the vertical bonds made per the flowchart of FIG. 18. The system moves along pin 23 from the bottom die up until it gets to die 6. Die 6 and die 2 are isolated from the bottom die 4. In step 264, the system sets a multiple hop vertical bond from die 6 to die 4. In practice, using the arrangement set forth above, the jump in an eight die stack will not exceed a vertical jump of three die. The system continues to increment N until the top die, which is also part of an isolated low voltage group. In step 264, the system then connects die 0 to die 2 (which was earlier set for connection to the bottom die as discussed above). At that point, all vertical connections are set, and the connections are made in step 270.

Those of skill in the art will appreciate alternative methods of making electrical connections between isolated groups of pins to the bottom die. In embodiments described above, wire bonds for step 102 (FIG. 6, single hop vertical connections), step 106 (diagonal connections) and step 110 (multiple hop vertical connections) are made either during or after each of those steps is completed. In a further embodiment, the connections in each of those steps may be set as described above, but all of the physical bonds made in these steps may be made at the completion of step 110.

It is a feature of the present technology that all die 302 may be wire bonded together with wire bond connections that minimize their length. As indicated in the Background section, longer wires also needed to be made thicker, so as to stay rigid and in place between its two end points. In addition, minimizing the length of wire used and having no jump longer three die allow the wire to be provided with a small wire diameter.

Figure 20:
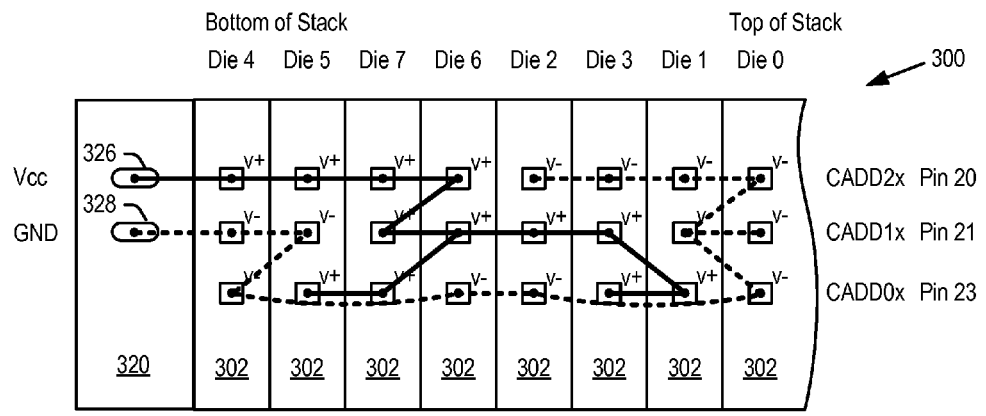
FIG. 20 is a top view of a die stack wire bonded to a substrate using a single ground and a single power pin.

The final bonding step 114 (FIG. 6) involves wire bonding the stack 300 to the substrate 320. Another feature of the present technology is that it allows the wired stack 300 to be electrically coupled to the substrate 320 using a minimum of contacts on the substrate. In particular, as shown in FIG. 20, all low voltage state connections to the address pins in the stack 300 are electrically coupled together, and all high voltage state connections to the address pins in the stack 300 are electrically coupled together. As such, the high voltage connections to all address pins (and any other pins coupled thereto) may be made to the stack 300 from a single power contact pad 326 on the substrate. Similarly, the low voltage connections to all address pins (and any other pins coupled thereto) may be made to the stack 300 from a single ground contact pad 328 on the substrate. This offers an improvement over connections made by the prior art, which require multiple ground and power pins to service a stack of four die or more.

Figures 21, 22:
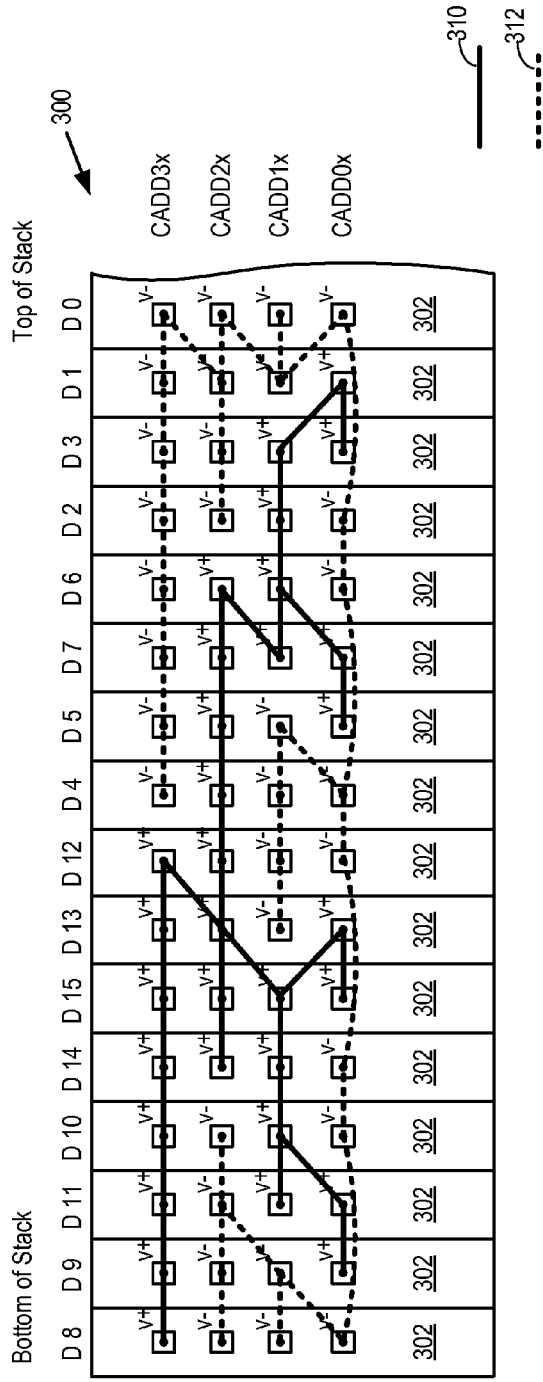
FIG. 21 is a schematic layout of a sixteen die stack ordered and wire bonded per an embodiment of the present technology.
FIG. 22 is a top view of the sixteen die stack ordered and wire bonded per the embodiment of FIG. 21.

As indicated above, the present technology may be used to wire bond die stacks 300 of different sizes. FIGS. 21 and 22 show an embodiment including a sixteen die stack 300. The sixteen die stack may be formed in the manner set forth in the above-described flowcharts for forming the eight die stack. In particular, the order of the die is set using gray code, and then the die are wire bonded by: 1) electrically connecting all aligned pins of the plurality of pins on adjacent die in the stack of like voltage state to each other, 2) electrically connecting all diagonal pins of the plurality of pins on adjacent die in the stack of like voltage state to each other, diagonal being to the next adjacent address pin, and 3) electrically connecting any isolated group of electrically connected pins to a bottom die in the stack adjacent the substrate. The single group of high voltage state pins may be mounted to a single power pin on the substrate. And the single group of low voltage state pins may be mounted to a single ground pin on the substrate.

At present, packages including die stacks with more than the above-discussed number of die are not feasible. However, given the above disclosure, those of skill in the art would appreciate how to sequentially provide such a die stack on the substrate per gray code, and then how to wire bond the die in the stack per the above disclosure. Such additional packages may for example include up to 32, or more, semiconductor die. With respect to small numbers of die in a die stack, the present technology may be used to wire a semiconductor package having one to four die, but wire bonding of such packages typically does not present problems such as those addressed by the present technology. Once there are five or more die in a package, three address lines are required to address each die in the stack, and the present technology may be used to efficiently wire bond such packages using a minimal number of contact pads on the substrate. While a configuration having eight die is more common than a configuration having five die, five die packages are known.

Figure 23:
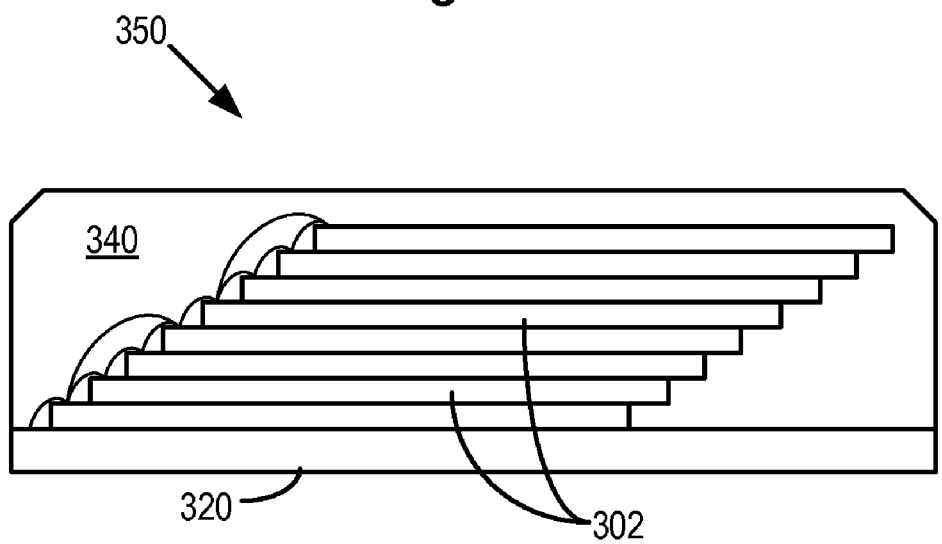
FIG. 23 is an edge view of a semiconductor package fabricated according to an embodiment of the present technology.

Referring again to an eight die stack, in a final production step 116 (FIG. 6), the wired stack 300 and substrate 320 may be encapsulated to form a finished package 350 as shown in FIG. 23. The die 302 and substrate 320, as well as all wire bonds, may be encapsulated in a resin molding compound 340 to form the finished semiconductor package 350. The finished package 350 may also be tested and inspected in step 116.

In an embodiment, the present technology provides a method of optimizing wire bonding within a semiconductor package including a stack of semiconductor die on a substrate, each semiconductor die including a plurality of pins for transferring signals to and from the die. The method includes the steps of: (a) setting an order of the die on the substrate based on ordering address pins of the plurality of pins on the die in the stack by gray code; and (b) affixing the die to the substrate in the order set in said step (a).

In a further embodiment, the present technology provides a method of optimizing wire bonding within a semiconductor package including a stack of between five or more semiconductor die on a substrate, each semiconductor die including a plurality of pins for transferring signals to and from the die, optimization of wire bonding minimizing power and ground pads on the substrate required to service address pins of the plurality of pins. In this embodiment, the method includes the steps of: (a) electrically connecting all address pins designated for a low voltage state to each other; (b) electrically connecting all address pins designated for a high voltage state to each other; (c) connecting all address pins for a low voltage state to a single ground contact pad on the substrate; and (d) connecting all address pins for a high voltage state to a single power contact pad on the substrate.

In a further embodiment, the present technology provides a method of optimizing wire bonding within a semiconductor package including a stack of semiconductor die on a substrate, each semiconductor die including a plurality of pins for transferring signals to and from the die. In this embodiment, the method includes the steps of: (a) electrically connecting all aligned pins of the plurality of pins on adjacent die in the stack of like voltage state to each other; (b) electrically connecting diagonal pins of the plurality of pins on adjacent die in the stack of like voltage state to each other, diagonal being to the next adjacent address pin on an adjacent die; and (c) electrically connecting any isolated group of electrically connected pins to a bottom die in the stack adjacent the substrate.

In a further embodiment, the present technology provides a method of optimizing wire bonding within a semiconductor package including a stack of semiconductor die on a substrate, each semiconductor die including a plurality of pins for transferring signals to and from the die. The method of this embodiment includes the steps of: (a) setting an order of the die on the substrate based on ordering address pins of the plurality of pins on the die in the stack by gray code; (b) affixing the die to the substrate in the order set in said step (a); (c) electrically connecting all aligned pins of the plurality of pins on adjacent die in the stack of like voltage state to each other; (d) electrically connecting diagonal pins of the plurality of pins on adjacent die in the stack of like voltage state to each other, diagonal being to the next adjacent address pin on an adjacent die; and (e) electrically connecting any isolated group of electrically connected low voltage state pins to a bottom die in the stack adjacent the substrate, said steps (c) through (e) resulting in all low voltage state pins being electrically coupled together in a single group.

The foregoing detailed description has been presented for purposes of illustration and description. It is not intended to be exhaustive or to limit the description to the precise form disclosed. Many modifications and variations are possible in light of the above teaching. The described embodiments were chosen in order to best explain the principles of the claimed method and its practical application to thereby enable others skilled in the art to best utilize the claimed method in various embodiments and with various modifications as are suited to the particular use contemplated. It is intended that the scope of the method be defined by the claims appended hereto.

I claim:

1. A method of wire bonding within a semiconductor package including a stack of semiconductor die on a substrate, each semiconductor die including a plurality of pins for transferring signals to and from the die, the method comprising the steps of:
   (a) providing address pins on two or more semiconductor die, the address pins on a semiconductor die identifying the semiconductor die;
   (b) setting an order of the two or more semiconductor die in a stack of semiconductor die based on ordering the address pins of the two or more semiconductor die in the stack by gray code; and
   (c) affixing the two or more semiconductor die in the die stack in the order set in said step (b).

2. The method of claim 1, said steps (b) and (c) comprising the steps of setting the order of three or more semiconductor die and affixing the semiconductor die to the substrate.

3. The method of claim 1, said step (b) of setting an order of the die on the substrate comprising the step of setting a die with an identification of 0 to the top die in the stack.

4. The method of claim 1, further comprising the steps of:
   (d) wire bonding the die to each other in the stack; and
   (e) wire bonding the stack to the substrate.

5. The method of claim 4, said step (d) of wire bonding the die to each other in the stack comprising the steps of:
   (d)(1) electrically connecting all address pins assigned a low voltage state to each other; and
   (d)(2) electrically connecting all address pins assigned a high voltage state to each other.

6. The method of claim 5, said step (e) of wire bonding the stack to the substrate comprising the step of:
   (e)(1) connecting all address pins assigned a low voltage state to a single ground contact pad on the substrate; and
   (e)(2) connecting all address pins assigned a high voltage state to a single power contact pad on the substrate.

7. The method of claim 4, said step (d) of wire bonding the die to each other in the stack comprising the steps of:
   (d)(1) electrically connecting all aligned pins of the plurality of pins on adjacent die in the stack of like voltage state to each other;
   (d)(2) electrically connecting diagonal pins of the plurality of pins on adjacent die in the stack of like voltage state to each other, diagonal being to the next adjacent address pin on an adjacent die; and
   (d)(3) electrically connecting any isolated group of electrically connected pins to the bottom die in the stack adjacent the substrate.

8. The method of claim 7, said step (d)(3) of electrically connecting any isolated group of electrically connected pins to a bottom die comprises the step of making a vertical jump between aligned pins.

9. The method of claim 4, said step (d) of wire bonding the die to each other in the stack comprising the steps of:
   (d)(1) electrically connecting all vertically aligned pins of the plurality of pins on adjacent die in the stack of like voltage state to each other;
   (d)(2) electrically connecting horizontal pins of the plurality of pins on a given die in the stack of like voltage state to each other, horizontal being to the next adjacent address pin on an the same die; and
   (d)(3) electrically connecting any isolated group of electrically connected pins to the bottom die in the stack adjacent the substrate.

10. A method of wire bonding within a semiconductor package including a stack of between five and thirty-two semiconductor die on a substrate, each semiconductor die including a plurality of pins for transferring signals to and from the die, the method comprising the steps of:
    (a) electrically connecting address pins designated for a low voltage state to each other;
    (b) electrically connecting address pins designated for a high voltage state to each other;
    (c) connecting address pins for a low voltage state to a ground contact pad on the substrate; and
    (d) connecting address pins for a high voltage state to a power contact pad on the substrate.

11. The method of claim 10, further comprising a step of affixing the die on the substrate and each other in an order determined through the use of gray coding of the address pins on the die in the stack.

12. The method of claim 11, said step of affixing the die on the substrate comprising the step of affixing the die with die 0 at a top of the stack most distal from the substrate.

13. The method of claim 10, wherein said step (c) of connecting address pins for a low voltage state to a single ground contact pad on the substrate comprises the step of making a single hop connection between the ground contact pad and a low voltage state pin on the bottom die affixed to the substrate.

14. The method of claim 10, wherein said step (d) of connecting address pins for a high voltage state to a single power contact pad on the substrate comprises the step of making a single hop connection between the power contact pad and a high voltage state pin on the bottom die affixed to the substrate.

15. The method of claim 10, said step (a) comprising the steps of:
    (c)(1) electrically connecting aligned, high voltage state pins of the plurality of pins on adjacent die in the stack to each other;
    (c)(2) electrically connecting diagonal, high voltage state pins of the plurality of pins on adjacent die in the stack to each other, diagonal being to the next adjacent address pin on an adjacent die; and
    (c)(3) electrically connecting any isolated group of electrically connected high voltage state pins to a bottom die in the stack adjacent the substrate via a vertical wire bond connection.

16. The method of claim 10, said step (a) comprising the steps of:
    (c)(1) electrically connecting aligned, high voltage state pins of the plurality of pins on adjacent die in the stack to each other;
    (c)(2) electrically connecting diagonal, high voltage state pins of the plurality of pins on adjacent die in the stack to each other, diagonal being to the next adjacent address pin on an adjacent die; and
    (c)(3) electrically connecting an isolated group of electrically connected high voltage state pins to a bottom die in the stack adjacent the substrate via a vertical wire bond connection.

17. A method of wire bonding within a semiconductor package including a stack of semiconductor die on a substrate, each semiconductor die in a group of semiconductor die including a plurality of pins for transferring signals to and from the die, the method comprising the steps of:

(a) electrically connecting aligned pins of the plurality of pins on adjacent die in the stack of like voltage state to each other;
(b) electrically connecting diagonal pins of the plurality of pins on adjacent die in the stack of like voltage state to each other, diagonal being to the next adjacent address pin on an adjacent die; and
(c) electrically connecting an isolated group of electrically connected pins to a bottom die in the stack adjacent the substrate.

18. The method of claim 17, wherein said step (a) of electrically connecting aligned pins of the plurality of pins on adjacent die in the stack of like voltage state to each other comprises the step of wire bonding from a die at a top of the stack down to a die on the bottom of the stack adjacent the substrate.

19. The method of claim 17, wherein said step (a) of electrically connecting all aligned pins of the plurality of pins on adjacent die in the stack of like voltage state to each other comprises the step of digitally printing connections from one die to the next adjacent die.

20. The method of claim 17, wherein said step (b) of electrically connecting diagonal pins of the plurality of pins on adjacent die in the stack of like voltage state to each other comprises the step of wire bonding first and second diagonal pins of like voltage state to each other if the first and second diagonal pins are not already electrically coupled to each other through.

21. The method of claim 17, wherein said step (b) of electrically connecting diagonal pins of the plurality of pins on adjacent die in the stack of like voltage state to each other comprises the step of wire bonding diagonally from a first pin on a first die to a second pin on a second die adjacent the first die.

22. The method of claim 21, wherein said step (b) of electrically connecting diagonal pins of the plurality of pins on adjacent die in the stack of like voltage state to each other further comprises the step of wire bonding diagonally from a third pin on the third die to a fourth pin on a fourth die, the fourth pin having a higher pin number than the third pin.

23. The method of claim 21, wherein said step (b) of electrically connecting diagonal pins of the plurality of pins on adjacent die in the stack of like voltage state to each other further comprises the step of wire bonding diagonally from a fifth pin on fifth die to a sixth pin on a sixth die adjacent the fifth die, the fifth pin having a lower pin number than the sixth pin.

24. The method of claim 17, wherein said step (c) of electrically connecting any isolated group of electrically connected pins to a bottom die in the stack adjacent the substrate comprising making a vertical jump between a pin on the bottom die and a pin in any isolated group of electrically connected pins.

25. The method of claim 17, further comprising a step (d) of stacking the semiconductor die on the substrate in an order determined through use of gray coding of the address pins on the die in the stack.

26. The method of claim 25, said step (d) comprising the step of stacking die 0 as the top die in the stack most distal from the substrate.

27. The method of claim 26, said step (d) of using gray code and stacking die 0 at a top of the stack providing a single group of all high voltage state pins being electrically coupled to each other, the method further comprising wire bonding the single group of all high voltage state pins to the substrate using a single power contact pad on the substrate.

* * * * *